(12) United States Patent
Cheng et al.

(10) Patent No.: US 9,984,976 B2
(45) Date of Patent: May 29, 2018

(54) INTERCONNECT STRUCTURES AND METHODS OF FORMATION

(71) Applicant: APPLIED MATERIALS, INC., Santa Clara, CA (US)

(72) Inventors: Yana Cheng, San Jose, CA (US); Yong Cao, San Jose, CA (US); Srinivas Guggilla, San Jose, CA (US); Sree Rangasai Kesapragada, Milpitas, CA (US); Xianmin Tang, San Jose, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/041,454

(22) Filed: Feb. 11, 2016

(65) Prior Publication Data
US 2016/0240483 A1    Aug. 18, 2016

Related U.S. Application Data

(60) Provisional application No. 62/116,128, filed on Feb. 13, 2015.

(51) Int. Cl.
H01L 23/48      (2006.01)
H01L 23/532     (2006.01)
H01L 21/768     (2006.01)

(52) U.S. Cl.
CPC .. *H01L 23/53238* (2013.01); *H01L 21/76802* (2013.01); *H01L 21/76832* (2013.01); *H01L 21/76834* (2013.01); *H01L 23/5329* (2013.01); *H01L 23/53223* (2013.01); *H01L 23/53266* (2013.01); *H01L 23/53295* (2013.01)

(58) Field of Classification Search
CPC ......... H01L 21/76843; H01L 21/76879; H01L 21/76883
USPC ....... 438/638, 629, 637, 639, 640, 667, 668, 438/700, 701, 713
See application file for complete search history.

(56) References Cited

U.S. PATENT DOCUMENTS 5,702,981 A    12/1997  Maniar et al.
6,165,891 A    12/2000  Chooi et al.
6,358,842 B1    3/2002  Zhou et al.
6,495,251 B1   12/2002  Arbab et al.
(Continued)

OTHER PUBLICATIONS

Ogawa, et al., "Silicon—Aluminum Oxynitride Composite Films Deposited by Reactive Ion Beam Sputtering", IEEE 1999, pp. 775-778.

(Continued)

*Primary Examiner* — (Vikki) Hoa B Trinh
(74) *Attorney, Agent, or Firm* — Moser Taboada; Alan Taboada

(57) ABSTRACT

Interconnect structures and methods of formation of such interconnect structures are provided herein. In some embodiments, a method of forming an interconnect includes: depositing a silicon-aluminum oxynitride (SiAlON) layer atop a first layer of a substrate, wherein the first layer comprises a first feature filled with a first conductive material; depositing a dielectric layer over the silicon-aluminum oxynitride (SiAlON) layer; and forming a second feature in the dielectric layer and the silicon-aluminum oxynitride (SiAlON) layer to expose the first conductive material.

18 Claims, 6 Drawing Sheets

(56) References Cited

U.S. PATENT DOCUMENTS

| | | | |
|---|---|---|---|
| 9,030,013 B2* | 5/2015 | Peng | H01L 23/53238 257/758 |
| 2008/0283927 A1* | 11/2008 | Hierlemann | H01L 21/823807 257/369 |
| 2010/0252930 A1 | 10/2010 | Liao et al. | |

OTHER PUBLICATIONS

International Search Report and Written Opinion dated May 30, 2016 for PCT Application No. PCT/US2016/017523.

* cited by examiner

INTERCONNECT STRUCTURES AND METHODS OF FORMATION

CROSS-REFERENCE TO RELATED APPLICATIONS

This application claims benefit of U.S. provisional patent application Ser. No. 62/116,128, filed Feb. 13, 2015, which is herein incorporated by reference in its entirety.

FIELD

Embodiments of the present disclosure generally relate to substrate processing techniques, and more particularly to methods and apparatus for forming an etch stop layer in an interconnect structure.

BACKGROUND

Typically, in interconnect fabrication schemes, a dielectric insulating material is inserted between a low-k dielectric material and copper lines capped with cobalt to serve as an etch stop layer in via fabrication, as well as passivation protection for metal lines underneath. The feature sizes of components on integrated circuits have been steadily decreasing for the last several decades, leading to significant challenges in interconnection manufacturing, for example low resistance-capacitance (RC) delay and dimensional scaling. Thus, an alternative material with superior chemical and electrical performance that can accommodate RC delay and dimensional scaling may be useful.

Thus, the inventors have provided improved methods for forming an etch stop layer in an interconnect structure.

SUMMARY

Interconnect structures and methods of formation of such interconnect structures are provided herein. In some embodiments, a method of forming an interconnect includes depositing a silicon-aluminum oxynitride (SiAlON) layer atop a first layer of a substrate, wherein the first layer comprises a first feature filled with a first conductive material; depositing a dielectric layer over the silicon-aluminum oxynitride (SiAlON) layer; and forming a second feature in the dielectric layer and the silicon aluminum oxynitride (SiAlON) layer to expose the first conductive material.

In some embodiments, an interconnect includes: a substrate comprising a first dielectric layer having a first feature formed in the first dielectric layer, wherein the first feature is filled with a first conductive material; a silicon aluminum oxynitride (SiAlON) layer disposed atop the first dielectric layer; a second dielectric layer disposed over the silicon aluminum oxynitride (SiAlON) layer; a second feature formed through the second dielectric layer and the silicon aluminum oxynitride (SiAlON) layer and aligned with the first feature; and a second conductive material filling the second feature to form a conductive pathway from the first feature to the second feature.

In some embodiments, a computer readable medium is provided having instructions stored thereon that, when executed, causes a process chamber to perform a method of forming an interconnect. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

DETAILED DESCRIPTION

Methods and apparatus for forming an etch stop layer in an interconnect structure are provided herein. The inventive methods and apparatus provided herein advantageously provide an etch stop and passivation layer having high etch selectivity to low-k dielectric materials, low resistance-capacitance (RC) benefits; good oxygen/moisture barrier properties and copper diffusion barrier properties. The inventive methods described herein may be utilized in the formation of metal interconnects in an integrated circuit, or in the formation of a metal gate or a metal-contact gap fill process, as well as other suitable applications requiring an etch stop and passivation layer.

Figure 1:
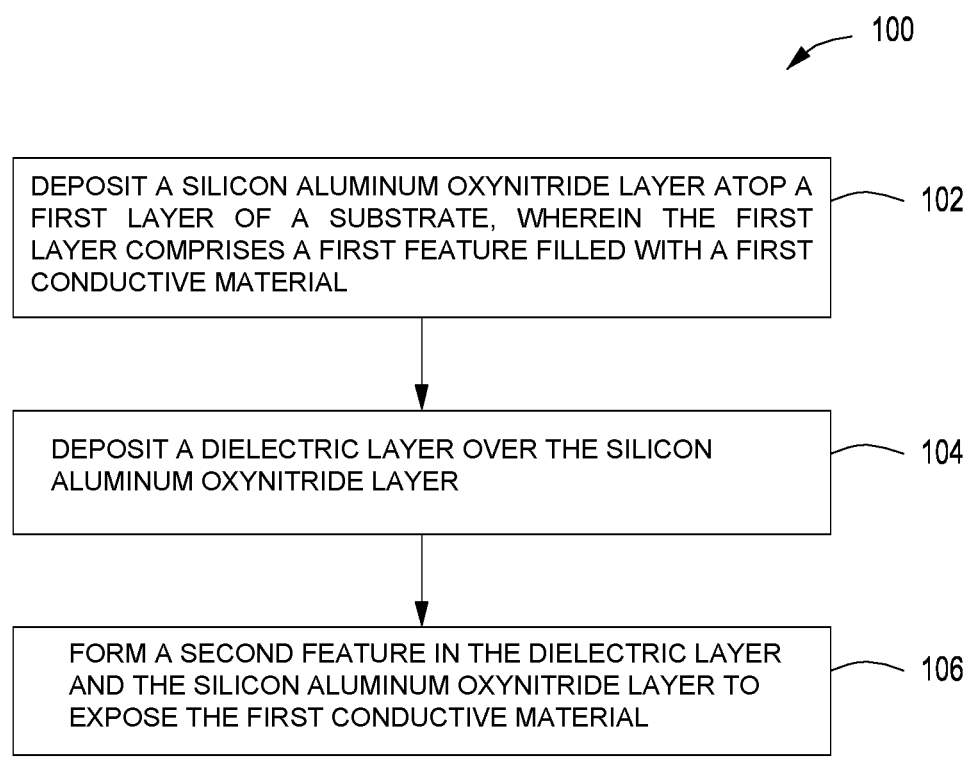
FIG. 1 depicts a flow chart of a method for forming an interconnect structure in accordance with some embodiments of the present disclosure.

FIG. 1 depicts a flow chart of a method 100 for forming an interconnect in accordance with some embodiments of the present disclosure. The method 100 is described below with respect to an interconnect structure, as depicted in FIGS. 2A-2F. The method 100 may be performed in any suitable process chambers, for example the process chamber depicted in FIG. 4, configured for a physical vapor deposition (PVD) process. Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

Figure 2A:
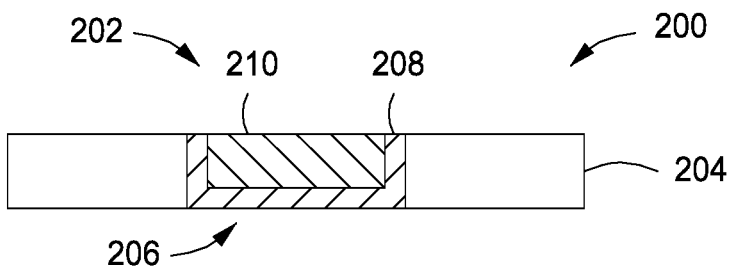
FIGS. 2A-2F depict side cross-sectional views of an interconnect structure formed in a substrate in accordance with some embodiments of the present disclosure.
Figure 2B:
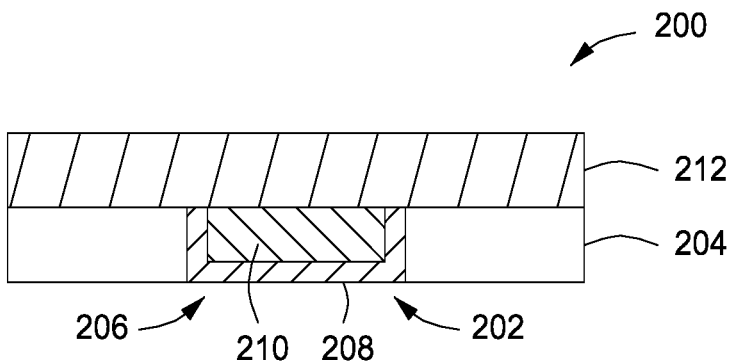

FIG. 2A depicts a substrate 200 having one or more conductive elements 202. The substrate 200 may be any suitable substrate, such as a semiconductor wafer. Substrates having other geometries, such as rectangular, polygonal, or other geometric configurations may also be used. In some embodiments, the substrate may include a first layer 204. The first layer 204 may be a base material of the substrate 200 (e.g., the substrate itself), or a layer formed on the substrate. For example, in some embodiments, the first layer 204 may be a dielectric layer (e.g. a first dielectric layer), such as silicon oxide, silicon nitride, silicon carbide, or the like. In some embodiments, a feature 206 (e.g. a first feature) is patterned and etched in the first layer 204 by a photolithography process. In some embodiments, after the feature 206 is formed, a barrier layer 208 is deposited over the first layer 204. The barrier layer 208 may serve to prevent diffusion of a subsequently deposited metal layer into underlying layers, such as the first layer 204. The barrier layer 208 may comprise any material suitable to act as a barrier. For example, in some embodiments, the barrier layer 208 may comprise a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 208 may have any thickness suitable to prevent the diffusion of subsequently deposited metal layer materials into underlying layers. The barrier layer 208 may be formed by any process suitable to provide the barrier layer 208 having a suitable thickness. For example, in some embodiments, the barrier layer 208 may be formed via a deposition process, such as chemical vapor deposition, physical vapor deposition, or a cyclical deposition process, for example, such as atomic layer deposition, or the like. A conductive material 210 (e.g. a first conductive material), such as copper, is deposited over the barrier layer 208 to fill the feature 206. The conductive material 210 may be deposited by any process suitable to provide the conductive material 210 to fill the feature 206. For example, in some embodiments, the conductive material 210 may be deposited via a deposition process, such as chemical vapor deposition, physical vapor deposition, or a cyclical deposition process, for example, such as atomic layer deposition, or the like. Further, when the feature 206 has been filled by the conductive material 210, the feature 206 may be filled above the level of the upper surface of the first layer 204 and/or deposited material, for example from the conductive material 210, may remain on the upper surface of the substrate 200. Accordingly, techniques, such as wet clean in an acidic solution, chemical or electrochemical mechanical polishing, or the like may be used to remove excess deposited material from the upper surface such that the feature 206 is filled with the deposited conductive material 210 up to about an equivalent level with the upper surface, as depicted in FIG. 2A.

The method 100 begins at 102 by depositing a silicon aluminum oxynitride (SiAlON) layer 212 atop the substrate 200, for example atop the first layer 204 (and in some embodiments, directly atop the first layer 204). The silicon aluminum oxynitride (SiAlON) layer 212 acts as an etch stop and passivation layer. The inventors have observed that the use of silicon aluminum oxynitride (SiAlON) as an etch stop and passivation layer advantageously provides improved electrical properties, such as higher breakdown wattage and lower leakage current, with a lesser thickness as comported to previously used multi-layer etch stop layer. For example, the inventors have observed that a silicon aluminum oxynitride (SiAlON) layer having a thickness of about 40 to about 80 angstroms, for example about 50 angstroms, advantageously provided the benefits described above, while typical multi-layer etch stop layers have a thickness of about 100 to about 150 angstroms.

In some embodiments, the silicon aluminum oxynitride (SiAlON) layer 212 is deposited by sputtering an aluminum (SiAlON) target in a first PVD process chamber using a first process gas, then transferring the substrate 200 to a second PVD process chamber to sputter a silicon target using a second process gas. In some embodiments, the first process gas comprises nitrogen ($N_2$) and an inert gas to deposit an aluminum nitride (AlN) layer and the second process gas comprises one of oxygen ($O_2$) and an inert gas to deposit a silicon oxide (SiOx) layer or comprises oxygen ($O_2$), nitrogen ($N_2$), and an inert gas to deposit a silicon oxynitride (SiON) layer. In some embodiments, the first process gas comprises oxygen ($O_2$) and an inert gas, to deposit an aluminum oxide (AlOx) layer and the second process gas comprises one of nitrogen ($N_2$) and an inert gas to deposit a silicon nitride (SiN) layer, or comprises oxygen ($O_2$), nitrogen ($N_2$), and an inert gas to deposit a silicon oxynitride (SiON) layer. In some embodiments, the first process gas comprises oxygen ($O_2$), nitrogen ($N_2$), and an inert gas to deposit an aluminum oxynitride (AlON) layer and the second process gas comprises one of oxygen ($O_2$), nitrogen ($N_2$), and an inert gas to deposit a silicon oxynitride (SiON) layer, or comprises nitrogen ($N_2$) and an inert gas to deposit a silicon nitride (SiN) layer, or comprises oxygen ($O_2$) and an inert gas to deposit a silicon oxide (SiOx) layer, or comprises an inert gas to deposit a silicon (Si) layer.

In some embodiments, the silicon aluminum oxynitride (SiAlON) layer 212 is deposited by simultaneously sputtering an aluminum target and a silicon target in a single process chamber using a process gas comprising oxygen ($O_2$), nitrogen ($N_2$) and an inert gas. In such embodiments, a physical vapor deposition chamber, such as the PVD chamber described below in FIG. 4, may have a target configuration as depicted in FIG. 5, where a first target 502, for example an aluminum target, and a second target 504, for example a silicon target, are configured above the substrate 500. In some embodiments, the silicon aluminum oxynitride (SiAlON) layer 212 is deposited by sputtering a silicon-aluminum target using a process gas comprising oxygen ($O_2$), nitrogen ($N_2$) and an inert gas. In some embodiments, the silicon-aluminum target is an aluminum target doped with silicon. In some embodiments, a suitable silicon-aluminum target has a silicon content of about 10 to about 100 ppm, for example about 30 ppm, with the balance being aluminum. In some embodiments, the silicon aluminum oxynitride (SiAlON) layer 212 is deposited by sputtering a silicon aluminum oxynitride (SiAlON) target using a process gas comprising an inert gas. In some embodiments, the inert gas is, for example, argon, helium, or the like.

Figure 4:
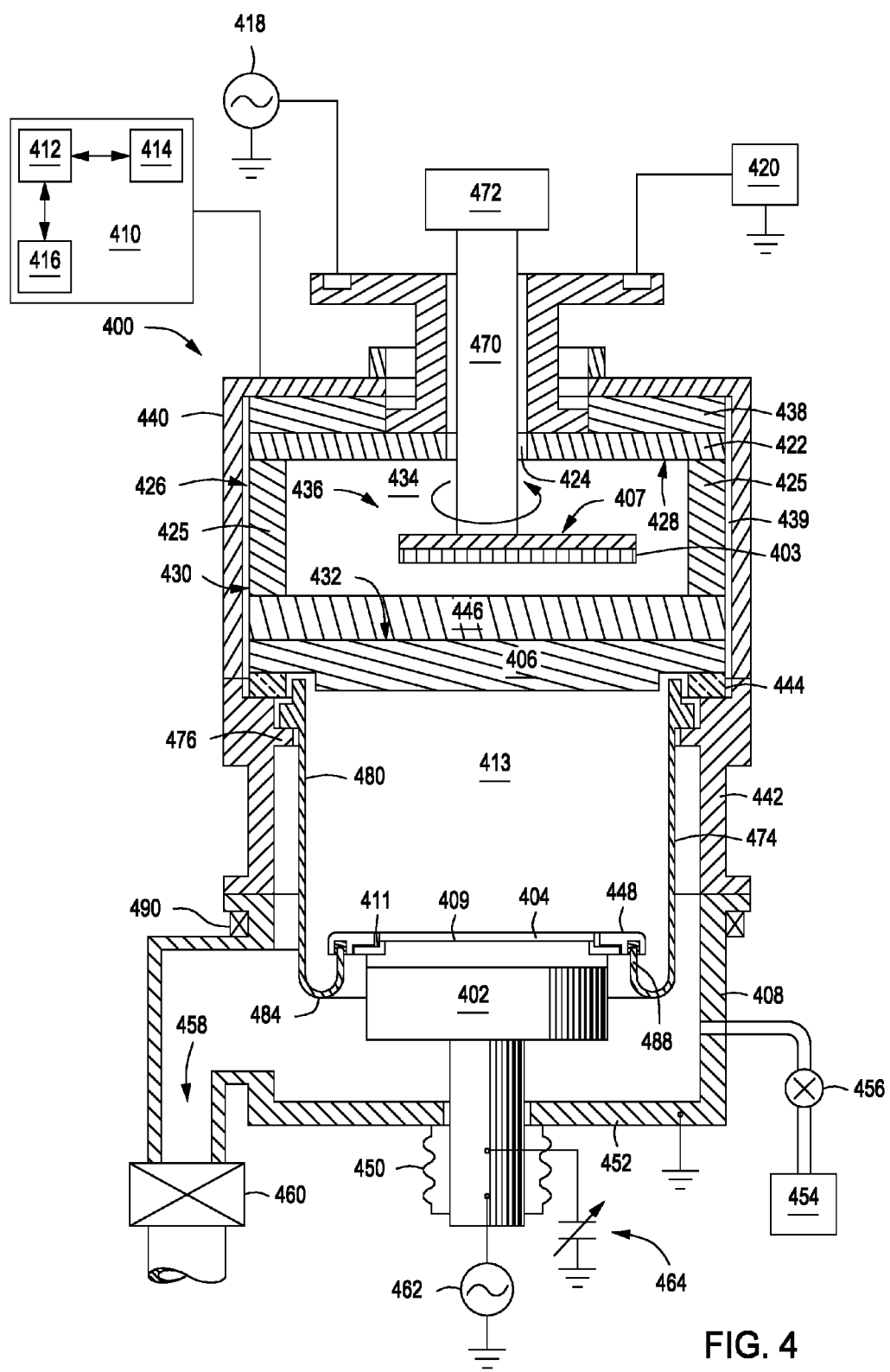
FIG. 4 depicts a schematic cross sectional view of a process chamber in accordance with some embodiments of the present disclosure.
Figure 5:
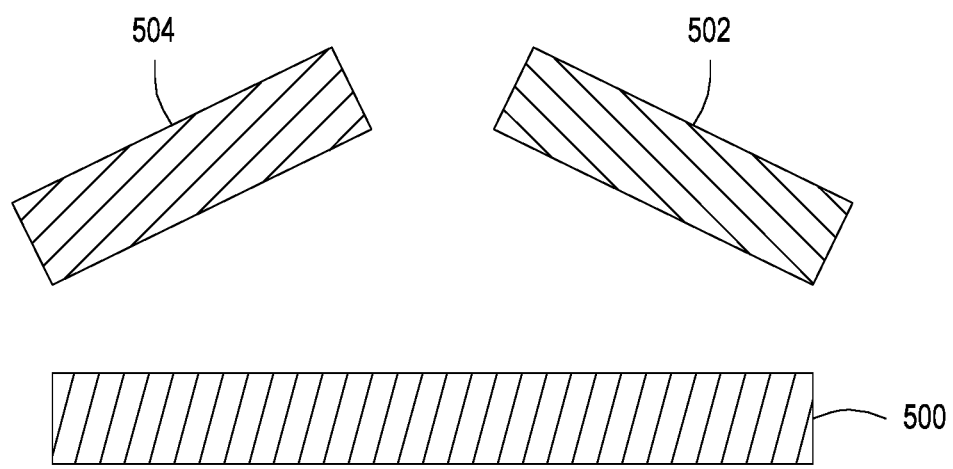
FIG. 5 depicts a schematic view of a target configuration for a physical vapor deposition process chamber in accordance with some embodiments of the present disclosure To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

In some embodiments, for example, the targets described above may be sputtered by forming a plasma in a physical vapor deposition process chamber, such as the PVD chamber described in FIG. 4. The plasma may be formed by coupling sufficient energy, for example radio frequency (RF) energy of direct current (DC) energy from a power source to ignite the process gas described above to form the plasma. In some embodiments, the power source may illustratively provide about 500 watts to about 10,000 watts of power at a suitable frequency, such as about 13.56 MHz. The plasma facilitates a sputtering of the target material, causing a deposition of material on the substrate 200, to form the silicon aluminum oxynitride (SiAlON) layer 212.

In some embodiments of depositing the silicon aluminum oxynitride (SiAlON) layer 212 as described above, nitrogen ($N_2$) gas is provided for example at a flow rate of about 80 to about 200 sccm, or a flow rate of up to about 100 sccm. In some embodiments of depositing the silicon aluminum oxynitride (SiAlON) layer 212 as described above, oxygen ($O_2$) gas is provided at a flow rate of about 1 sccm to about 4 sccm. In some embodiments of depositing the silicon aluminum oxynitride (SiAlON) layer 212 as described above, inert gas, such as argon, is provided for example at a flow rate of about 10 to about 50 sccm, or for example at up to about 25 sccm. In some embodiments, wherein the process gas comprises oxygen ($O_2$) gas and nitrogen ($N_2$) gas, the inventors have observed the oxygen ($O_2$) is more readily incorporated into the deposited film than nitrogen ($N_2$) because the oxygen ($O_2$) more readily reacts with sputtered aluminum and silicon material. In such embodiments, the flow rate of nitrogen ($N_2$) gas provided to the process chamber is greater than the flow rate of oxygen ($O_2$) gas. General processing conditions for forming the silicon aluminum oxynitride (SiAlON) layer 212 include maintaining process chamber pressure at about 4 to about 10 Torr and maintaining process temperature at about room temperature (e.g. 25 degrees Celsius) to about 375 degrees Celsius.

Figure 2C:
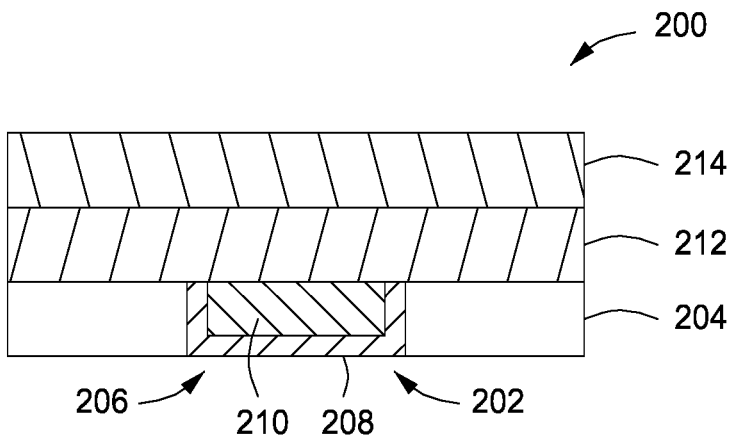
Figure 2D:
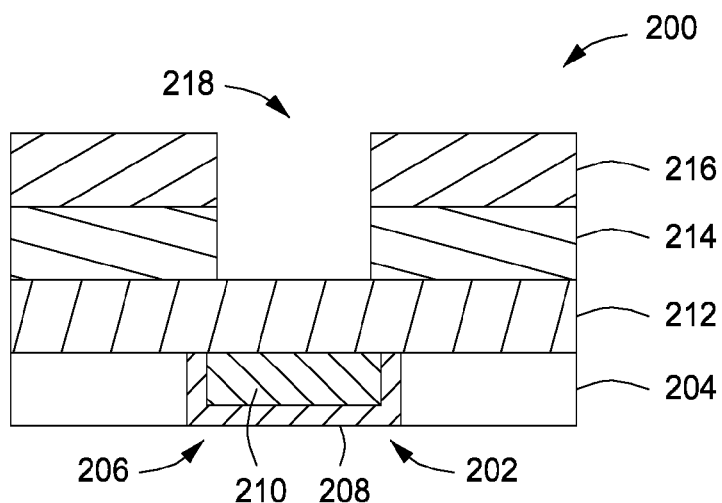

Next, at 104, and as depicted in FIG. 2C, a dielectric layer 214 is deposited over the silicon aluminum oxynitride (SiAlON) layer 212. In some embodiments, the dielectric layer 214 (e.g. a second dielectric layer) may be silicon oxide, silicon nitride, silicon carbide, or the like. Next at 106, and as depicted in FIG. 2D, a feature 218 (e.g. a second feature) aligned with the feature 206 is etched in the dielectric layer 214 and the silicon aluminum oxynitride (SiAlON) layer 212 to expose the conductive material 210. As depicted in FIG. 2D, the feature 218 is formed by forming a patterned mask layer 216 over the dielectric layer 214 to etch the feature 218 into the dielectric layer 214 to the top surface of the silicon aluminum oxynitride (SiAlON) layer 212. The silicon aluminum oxynitride (SiAlON) layer 212 has a high selectivity with respect to the dielectric layer 214 to advantageously function as an etch stop layer. As used herein, high etch selectivity is related to different etching rate ratios between chemically different materials such as the dielectric layer 214 and the silicon aluminum oxynitride (SiAlON) layer 212 that is sufficient to facilitate substantially complete removal of the dielectric layer 214 without etching through the silicon aluminum oxynitride (SiAlON) layer 212.

The patterned mask layer 216 may be any suitable mask layer such as a hard mask or photoresist layer. The patterned mask layer 216 may be formed by any process suitable to form a patterned mask layer capable of providing an adequate template for defining a pattern in the underlying dielectric layer 214. For example, in some embodiments, the patterned mask layer may be formed via a patterned etch process. In some embodiments, the feature 218 may be a trench or a via. The feature 218 may be etched via any etching process suitable for etching a dielectric material to form an feature 218 having vertical or substantially vertical sidewalls. For example, the substrate 200 may be exposed to an etching plasma formed using a halogen containing gas, for example a fluorine-containing gas such as carbon tetrafluoride (CEO, methyl trifluoride ($CHF_3$), octafluorocyclobutane ($C_4F_5$), hexafluorobutadiene ($C_4F_6$), nitrogen trifluoride ($NF_3$), sulfur hexafluoride ($SF_6$), or the like.

Figure 2E:
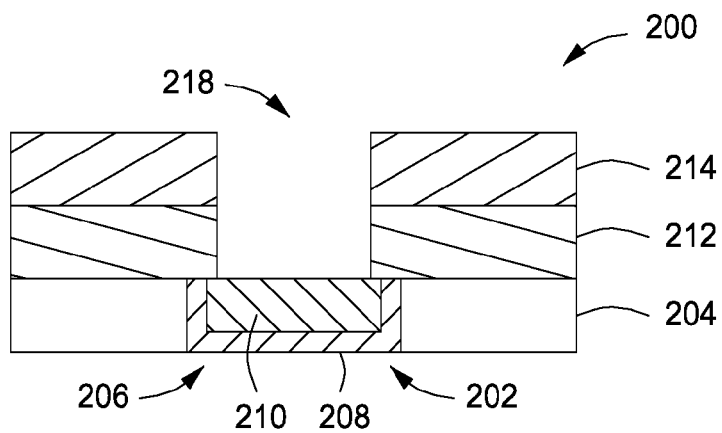

As depicted in FIG. 2E, the feature 218 is defined in the silicon aluminum oxynitride (SiAlON) layer 212. The feature 218 may be etched in the silicon aluminum oxynitride (SiAlON) layer 212 via any etching process suitable for etching the silicon aluminum oxynitride (SiAlON) layer 212 to form an feature 218 having vertical or substantially vertical sidewalls. For example, the substrate 200 may be exposed to a wet etch process using for example hydrogen fluoride (HF).

Figure 2F:
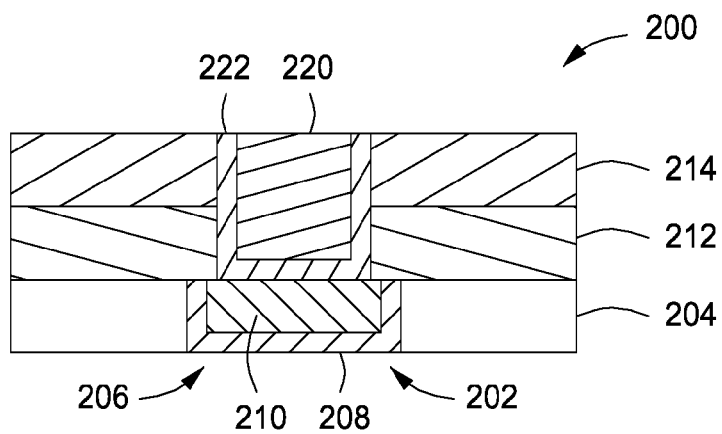

Following formation of the feature 218, as depicted in FIG. 2F, the feature 218 may be filled with a second conductive material (e.g., conductive material 220). The conductive material 220 may include metals, metal alloys, or the like, such as one or more of copper (Cu), aluminum (Al), tungsten (W), or the like. In some embodiments, the conductive material 220 is copper. The feature 218 is aligned with the conductive element 202 such that the feature 218, when filled with a conductive material 220, provides an electrical path to and from the conductive element 202. For example, the conductive material may be part of a line or via to which the interconnect is coupled. Further, when the feature 218 has been filled by the conductive material 220, the feature 218 may be filled above the level of the upper surface of the substrate and/or deposited material, for example from the conductive material 220, may remain on the upper surface of the substrate 200. Accordingly, techniques, such as wet clean in an acidic solution, chemical or electrochemical mechanical polishing, or the like may be used to remove excess deposited material from the upper surface, such the feature 218 is filled with the deposited conductive material 220 up to about an equivalent level with the upper surface, as depicted in FIG. 2F.

In some embodiments, prior to filling the feature 218 with a conductive material 220, a barrier layer 222 may be deposited into the feature 218. The barrier layer 222 may serve to prevent diffusion of the subsequently deposited conductive material 220 layer into underlying layers. The barrier layer 222 may comprise any material suitable to act as a barrier as describe above.

Figure 3:
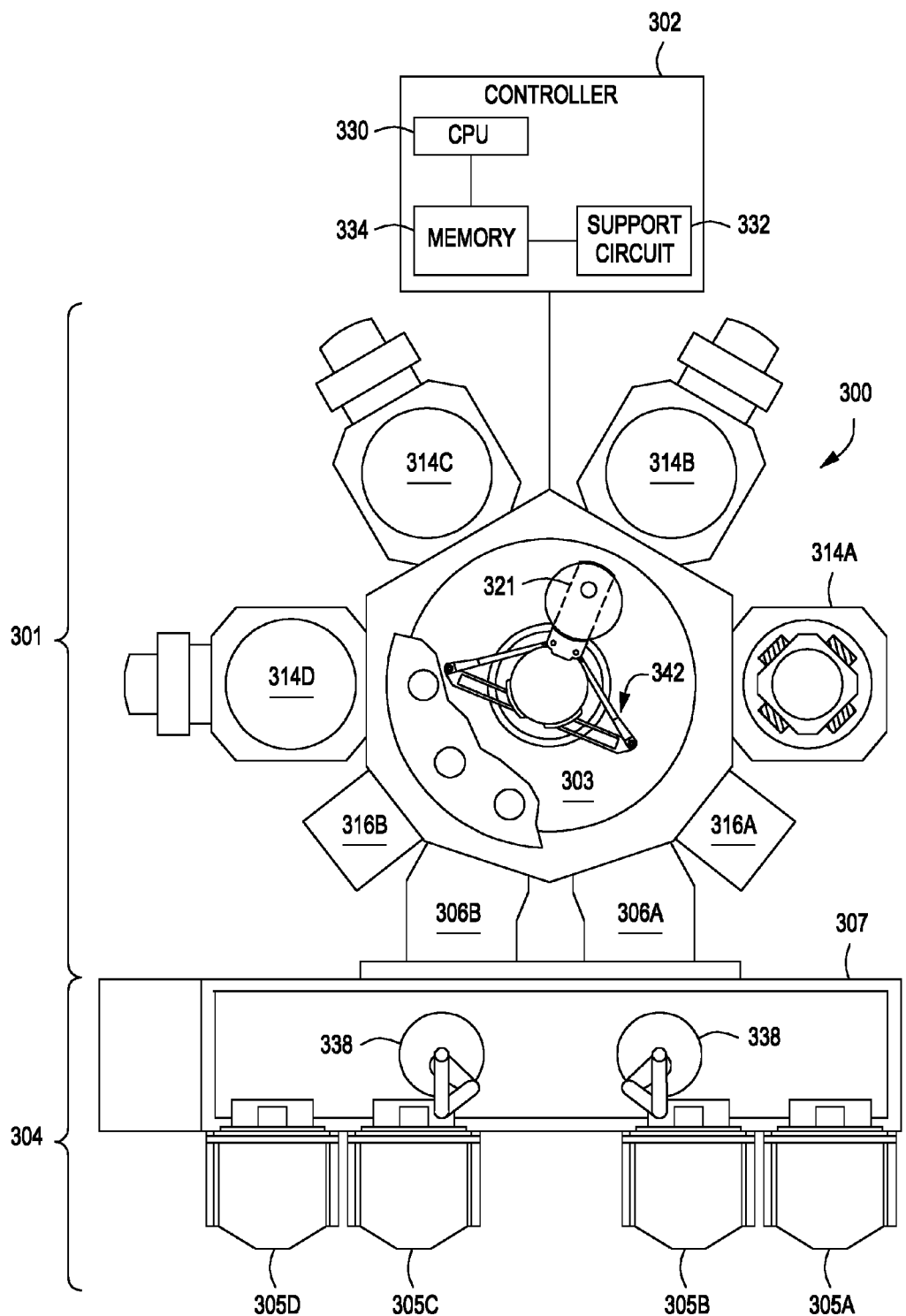
FIG. 3 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform (processing platform 301), a factory interface 304, and a system controller 302. The processing platform 301 comprises multiple processing chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least a physical vapor deposition (CVD) chamber, and optionally, an annealing chamber. Additional chambers may also be provided such as additional PVD chambers and/or annealing chambers, a chemical vapor deposition (CVD) chamber, or the like. PVD chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

FIG. 4 depicts a simplified, cross-sectional view of a physical vapor deposition (PVD) chamber (chamber 400), suitable for performing the method 100 described above. Examples of PVD chambers suitable for modification in accordance with the teachings provided herein include chambers having very high frequency (VHF) sources, the ALPS® Plus and SIP ENCORE® PVD processing chambers, both commercially available from Applied Materials, Inc., of Santa Clara, Calif.

The chamber 400 contains a substrate support 402 for receiving a substrate 404 on the substrate support, and a sputtering source, such as a target 406. In some embodiments, the substrate support is configured as an electrostatic chuck The substrate support 402 may be located within a grounded enclosure wall (e.g., chamber wall 408), which may be a chamber wall (as shown) or a grounded shield (a ground shield 440 is shown covering at least some portions of the chamber 400 above the target 406. In some embodiments, the ground shield 440 could be extended below the target to enclose the substrate support 402 as well).

In some embodiments, the process chamber includes a feed structure for coupling RF and DC energy to the target 406. The feed structure is an apparatus for coupling RF and DC energy to the target, or to an assembly containing the target, for example, as described herein. A first end of the feed structure can be coupled to an RF power source 418 and a DC power source 420, which can be respectively utilized to provide RF and DC energy to the target 406. For example, the DC power source 420 may be utilized to apply a negative voltage, or bias, to the target 406. In some embodiments, RF energy supplied by the RF power source 418 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 418 and the DC power source 420. In some embodiments, about 6 kW of 40 MHz RF is provided at the same time about 1 kW of DC power is provided. In some embodiments, the RF power is provided at about 4 kW to about 8 Kw at a frequency of about 13.56 MHz to about 60 MHz, and the DC power simultaneously at about 0.5 kW to about 2 kW.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure). The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 422. The source distribution plate includes a hole 424 disposed through the source distribution plate 422 and aligned with a central opening of the feed structure. The source distribution plate 422 may be fabricated from suitable conductive materials to conduct the RF and DC energy from the feed structure.

The source distribution plate 422 may be coupled to the target 406 via a conductive member 425. The conductive member 425 may be a tubular member having a first end 426 coupled to a target-facing surface 428 of the source distribution plate 422 proximate the peripheral edge of the source distribution plate 422. The conductive member 425 further includes a second end 430 coupled to a source distribution plate-facing surface 432 of the target 406 (or to the backing plate 446 of the target 406) proximate the peripheral edge of the target 406.

A cavity 434 may be defined by the inner-facing walls of the conductive member 425, the target-facing surface 428 of the source distribution plate 422 and the source distribution plate-facing surface 432 of the target 406. The cavity 434 is fluidly coupled to the central opening of the body via the hole 424 of the source distribution plate 422. The cavity 434 and the central opening of the body may be utilized to at least partially house one or more portions of a rotatable magnetron assembly 436. In some embodiments, the cavity may be at least partially filled with a cooling fluid, such as water ($H_2O$) or the like.

A ground shield 440 may be provided to cover the outside surfaces of the lid of the chamber 400. The ground shield 440 may be coupled to ground, for example, via the ground connection of the chamber body. The ground shield 440 has a central opening to allow the feed structure to pass through the ground shield 440 to be coupled to the source distribution plate 422. The ground shield 440 may comprise any suitable conductive material, such as aluminum, copper, or the like. An insulative gap 439 is provided between the ground shield 440 and the outer surfaces of the source distribution plate 422, the conductive member 425, and the target 406 (and/or backing plate 446) to prevent the RF and DC energy from being routed directly to ground. The insulative gap may be filled with air or some other suitable dielectric material, such as a ceramic, a plastic, or the like.

An isolator plate 438 may be disposed between the source distribution plate 422 and the ground shield 440 to prevent the RF and DC energy from being routed directly to ground. The isolator plate 438 has a central opening to allow the feed structure to pass through the isolator plate 438 and be coupled to the source distribution plate 422. The isolator plate 438 may comprise a suitable dielectric material, such as a ceramic, a plastic, or the like. Alternatively, an air gap may be provided in place of the isolator plate 438. In embodiments where an air gap is provided in place of the isolator plate, the ground shield 440 may be structurally sound enough to support any components resting upon the ground shield 440.

The target 406 may be supported on a grounded conductive aluminum adapter 442 through a dielectric isolator 444. The target 406 comprises a material to be deposited on the substrate 404 during sputtering, such a metal or metal oxide. In some embodiments, the backing plate 446 may be coupled to the source distribution plate-facing surface 432 of the target 406. The backing plate 446 may comprise a conductive material, such as copper-zinc, copper-chrome, or the same material as the target, such that RF and DC power can be coupled to the target 406 via the backing plate 446. Alternatively, the backing plate 446 may be non-conductive and may include conductive elements (not shown) such as electrical feedthroughs or the like for coupling the source distribution plate-facing surface 432 of the target 406 to the second end 430 of the conductive member 425. The backing plate 446 may be included for example, to improve structural stability of the target 406.

The substrate support 402 has a material-receiving surface facing the principal surface of the target 406 and supports the substrate 404 to be sputter coated in planar position opposite to the principal surface of the target 406. The substrate support 402 may support the substrate 404 in a first volume 413 of the chamber 400. The first volume 413 is defined as the region above the substrate support 402 during processing (for example, between the target 406 and the substrate support 402 when in a processing position).

In some embodiments, the substrate support 402 may be vertically movable through a bellows 450 connected to a bottom chamber wall 452 to allow the substrate 404 to be transferred onto the substrate support 402 through a load lock valve (not shown) in the lower portion of processing the chamber 400 and subsequently raised to a deposition, or processing position. One or more processing gases may be supplied from a gas source 454 through a mass flow controller 456 into the lower part of the chamber 400. An exhaust port 458 may be provided and coupled to a pump (not shown) via a valve 460 for exhausting the interior of the chamber 400 and facilitating maintaining a pressure inside the chamber 400.

An RF bias power source 462 may be coupled to the substrate support 402 in order to induce a negative DC bias on the substrate 404. In addition, in some embodiments, a negative DC self-bias may form on the substrate 404 during processing. For example, RF power supplied by the RF bias power source 462 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support 402 and provide any of the frequencies discussed above for use with the RF bias power source 462. In other applications, the substrate support 402 may be grounded or left electrically floating. For example, a capacitance tuner 464 may be coupled to the substrate support for adjusting voltage on the substrate 404 for applications where RF bias power may not be used. In some embodiments, the capacitance tuner 464 may be used to adjust the substrate floating potential so that ion energy arriving at the substrate can be controlled. In some embodiments, the RF bias power source 462 and the capacitance tuner 464 may both be applied simultaneously.

A rotatable magnetron assembly 436 may be positioned proximate a back surface (e.g., source distribution plate-facing surface 432) of the target 406. The rotatable magnetron assembly 436 includes the magnetron 407 which connects to a rotation shaft 470 coincident with the central axis of the chamber 400 and the substrate 404. A motor 472 can be coupled to the upper end of the rotation shaft 470 to drive rotation of the magnetron assembly 436. The magnets 403 produce a magnetic field within the chamber 400, generally parallel and close to the surface of the target 406 to trap electrons and increase the local plasma density, which in turn increases the sputtering rate. The magnets 403 produce an electromagnetic field around the top of the chamber 400, and the magnets are rotated to rotate the electromagnetic field which influences the plasma density of the process to more uniformly sputter the target 406. For example, the rotation shaft 470 may make about 0 to about 150 rotations per minute.

The chamber 400 further includes a process kit shield, or shield 474, to surround the processing, or first volume 413 of the chamber 400 and to protect other chamber components from damage and/or contamination from processing. In some embodiments, the shield 474 may be a grounded shield connected to a ledge 476 of an adapter 442

The shield 474 extends downward and may include one or more sidewalls 480 configured to surround the first volume 413. The shield 474 extends downward along the walls of the adapter 442 and the chamber wall 408 to below an upper surface of the substrate support 402, radially inward, and then returns upward to form an upwardly extending lip 488, for example, reaching an upper surface of the substrate support 402 (e.g., forming a u-shaped portion 484 at the bottom). Alternatively, the bottommost portion of the shield 474 need not be a u-shaped portion 484 and may have any suitable shape. A first ring 448 (i.e., a cover ring) rests on the top of the upwardly extending lip 488 of the shield 474 when the substrate support 402 is in a lower, loading position. When the substrate support 402 is in an upper position, the first ring 448 rests on the top of the upwardly extending lip 488 of the shield 474 and the outer periphery of the substrate support 402.

An additional second ring 411 (i.e., a deposition ring) may be used to protect the substrate support 402 from sputter deposition. For example, the second ring 411 may be disposed about a peripheral edge of the substrate support 402 and adjacent to the substrate processing surface 409 as illustrated in FIG. 1. In some embodiments, the second ring 411 may shield exposed surfaces of the substrate support 402 as shown.

In some embodiments, a magnet 490 may be disposed about the chamber 400 for selectively providing a magnetic field between the substrate support 402 and the target 406. For example, the magnet 490 may be disposed about the outside of the chamber wall 408 in a region just above the substrate support 402 when in processing position. In some embodiments, the magnet 490 may be disposed additionally or alternatively in other locations, such as adjacent the adapter 442. The magnet 490 may be an electromagnet and may be coupled to a power source (not shown) for controlling the magnitude of the magnetic field generated by the electromagnet.

A controller 410 may be provided and coupled to various components of the chamber 400 to control the operation of the chamber 400. The controller 410 includes a central processing unit (CPU) 412, a memory 414, and support circuits 416. The controller 410 may control the chamber 400 directly, or via computers (or controllers) associated with particular process chamber and/or support system components. The controller 410 may be any form of general-purpose computer processor that can be used in an industrial setting for controlling various chambers and sub-processors. The memory, or computer readable medium, 414 of the controller 410 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 416 are coupled to the CPU 412 for supporting the processor in a conventional manner. Support circuits 416 typically include cache, power supplies, clock circuits, input/output circuitry and subsystems, and the like. Inventive methods as described herein may be stored in the memory 414 as software routine that may be executed or invoked to control the operation of the chamber 400 in the manner described herein. The software routine may also be stored and/or executed by a second CPU (not shown) that is remotely located from the hardware being controlled by the CPU 412.

While the foregoing is directed to embodiments of the present disclosure, other and further embodiments of the disclosure may be devised without departing from the basic scope thereof.

The invention claimed is:

1. A method of forming an interconnect, comprising:
   depositing a silicon-aluminum oxynitride (SiAlON) layer atop a first layer of a substrate, wherein the first layer comprises a first feature filled with a first conductive material by one of:
   sputtering an aluminum target and sputtering a silicon target;
   sputtering a silicon-aluminum target using a process gas comprising nitrogen (N2), oxygen (O2), and argon (Ar); or
   sputtering a silicon aluminum oxynitride (SiAlON) target using a process gas comprising argon (Ar);
   depositing a dielectric layer over the silicon-aluminum oxynitride (SiAlON) layer; and
   forming a second feature in the dielectric layer and the silicon-aluminum oxynitride (SiAlON) layer to expose the first conductive material.

2. The method of claim 1, wherein depositing the silicon-aluminum oxynitride (SiAlON) layer comprises:
   sputtering the aluminum target; and
   sputtering the silicon target.

3. The method of claim 2, further comprising:
   simultaneously sputtering the aluminum target and the silicon target in a process chamber using a process gas comprising oxygen (O$_2$), nitrogen (N$_2$) and argon (Ar).

4. The method of claim 2, further comprising:
   sputtering the aluminum target in a first process chamber using a first process gas;
   transferring the substrate to a second process chamber; and
   sputtering the silicon target in the second process chamber using a second process gas.

5. The method of claim 4, wherein the first process gas comprises nitrogen (N$_2$) and argon (Ar) and the second process gas comprises one of: oxygen (O$_2$) and argon (Ar); or oxygen (O$_2$), nitrogen (N$_2$), and argon (Ar).

6. The method of claim 4, wherein the first process gas comprises oxygen (O$_2$) and argon (Ar) and the second process gas comprises one of: nitrogen (N$_2$) and argon (Ar); or oxygen (O$_2$), nitrogen (N$_2$), and argon (Ar).

7. The method of claim 4, wherein the first process gas comprises oxygen (O$_2$), nitrogen (N$_2$), and argon (Ar) and the second process gas comprises one of: oxygen (O$_2$), nitrogen (N$_2$), and argon (Ar); nitrogen (N$_2$) and argon (Ar); oxygen (O$_2$) and argon (Ar); or only argon (Ar).

8. The method of claim 1, wherein depositing the silicon-aluminum oxynitride (SiAlON) layer further comprises sputtering the silicon-aluminum target using the process gas comprising nitrogen (N$_2$), oxygen (O$_2$), and argon (Ar).

9. The method of claim 8, wherein nitrogen is provided at a flow rate of up to about 100 sccm, oxygen is provided at a flow rate of about 1 sccm to about 4 sccm, and argon is provided at a flow rate of up to about 25 sccm.

10. The method of claim 1, wherein depositing the silicon-aluminum oxynitride (SiAlON) layer further comprises sputtering the silicon aluminum oxynitride (SiAlON) target using the process gas comprising argon (Ar).

11. The method of claim 1, wherein the silicon-aluminum oxynitride (SiAlON) layer is deposited to a thickness of about 40 to about 80 angstroms.

12. The method of claim 1, wherein forming the second feature in the dielectric layer and the silicon-aluminum oxynitride (SiAlON) layer further comprises:
   depositing a photoresist layer atop the dielectric layer;
   patterning the photoresist layer;
   etching the dielectric layer to a top surface of the silicon-aluminum oxynitride (SiAlON) layer; and
   etching the silicon-aluminum oxynitride (SiAlON) layer to expose the first conductive material.

13. The method of claim 12, further comprising etching the dielectric layer using a fluorine-containing gas.

14. The method of claim 12, further comprising etching the silicon-aluminum oxynitride (SiAlON) layer using a wet etch process.

15. The method of claim 1, further comprising depositing a second conductive material to fill the second feature.

16. A method of forming an interconnect, comprising:
   depositing a silicon-aluminum oxynitride (SiAlON) layer atop a first layer of a substrate, wherein the first layer comprises a first feature filled with a first conductive material, wherein the silicon-aluminum oxynitride (SiAlON) layer is deposited to a thickness of about 40 to about 80 angstroms;

depositing a dielectric layer over the silicon-aluminum oxynitride (SiAlON) layer; and forming a second feature in the dielectric layer and the silicon-aluminum oxynitride (SiAlON) layer to expose the first conductive material.

17. A method of forming an interconnect, comprising:

depositing a silicon-aluminum oxynitride (SiAlON) layer atop a first layer of a substrate, wherein the first layer comprises a first feature filled with a first conductive material;

depositing a dielectric layer over the silicon-aluminum oxynitride (SiAlON) layer; and forming a second feature in the dielectric layer and the silicon-aluminum oxynitride (SiAlON) layer to expose the first conductive material by:

depositing a photoresist layer atop the dielectric layer;
patterning the photoresist layer;

etching the dielectric layer to a top surface of the silicon-aluminum oxynitride (SiAlON) layer; and etching the silicon-aluminum oxynitride (SiAlON) layer to expose the first conductive material.

18. A method of forming an interconnect, comprising:

depositing a silicon-aluminum oxynitride (SiAlON) layer atop a first layer of a substrate, wherein the first layer comprises a first feature filled with a first conductive material;

depositing a dielectric layer over the silicon-aluminum oxynitride (SiAlON) layer;

forming a second feature in the dielectric layer and the silicon-aluminum oxynitride (SiAlON) layer to expose the first conductive material; and depositing a second conductive material to fill the second feature.

* * * * *

UNITED STATES PATENT AND TRADEMARK OFFICE
CERTIFICATE OF CORRECTION

PATENT NO. : 9,984,976 B2
APPLICATION NO. : 15/041454
DATED : May 29, 2018
INVENTOR(S) : Yana Cheng et al.

Page 1 of 1

It is certified that error appears in the above-identified patent and that said Letters Patent is hereby corrected as shown below:

In the Specification

In Column 5, Line 53, delete "CEO" and substitute therefor --$CF_4$--;

In Column 5, Line 54, delete "$C_4C_5$" and substitute therefor --$C_4F_8$--.

Signed and Sealed this
Thirty-first Day of July, 2018

Andrei Iancu
*Director of the United States Patent and Trademark Office*